US009997484B2

(12) United States Patent
Maeda et al.

(10) Patent No.: US 9,997,484 B2
(45) Date of Patent: Jun. 12, 2018

(54) SEMICONDUCTOR DEVICE AND MANUFACTURING METHOD OF THE SAME

(71) Applicant: TOSHIBA MEMORY CORPORATION, Tokyo (JP)

(72) Inventors: Takeori Maeda, Mie Mie (JP); Masatoshi Fukuda, Yokohama Kanagawa (JP); Ryoji Matsushima, Yokkaichi Mie (JP); Hideo Aoki, Yokohama Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days. days.

(21) Appl. No.: 15/252,139

(22) Filed: Aug. 30, 2016

(65) Prior Publication Data
US 2017/0263582 A1 Sep. 14, 2017

(30) Foreign Application Priority Data

Mar. 11, 2016 (JP) .................................. 2016-048898

(51) Int. Cl.
*H01L 23/00* (2006.01)
*H01L 23/31* (2006.01)
*H01L 21/56* (2006.01)

(52) U.S. Cl.
CPC .............. *H01L 24/17* (2013.01); *H01L 21/56* (2013.01); *H01L 23/3142* (2013.01);
(Continued)

(58) Field of Classification Search
CPC ....... H01L 25/0657; H01L 2224/27334; H01L 2224/26125; H01L 2224/06517
(Continued)

(56) References Cited

U.S. PATENT DOCUMENTS 7,309,923 B2 12/2007 Kee
7,659,623 B2 2/2010 Watanabe et al.
(Continued)

FOREIGN PATENT DOCUMENTS

JP 4795248 10/2011
JP 2012-256934 12/2012
(Continued)

*Primary Examiner* — Steven Loke
*Assistant Examiner* — Krista Soderholm
(74) *Attorney, Agent, or Firm* — Patterson & Sheridan, LLP

(57) ABSTRACT

A semiconductor device includes a wiring substrate, a first semiconductor element, a second semiconductor element, a bump, a bonding portion, and a resin portion. The second semiconductor element is between the wiring substrate and the first semiconductor element. The bump is between the first and second semiconductor elements and electrically connects the first and second semiconductor elements. The bonding portion is between the first and second semiconductor elements, bonds the first semiconductor element to the second semiconductor element, and has a first elastic modulus. The resin portion has a second elastic modulus higher than the first elastic modulus. The resin portion is between the first and second semiconductor elements. The first semiconductor element is between a second portion of the resin portion and the wiring substrate. A third portion of the resin portion is overlapped with the first and second semiconductor elements.

16 Claims, 9 Drawing Sheets

(52) U.S. Cl.
CPC ............... *H01L 24/11* (2013.01); *H01L 24/81* (2013.01); *H01L 2224/1712* (2013.01)

(58) Field of Classification Search
USPC ......................................................... 257/657
See application file for complete search history.

(56) References Cited

U.S. PATENT DOCUMENTS

| | | | |
|---|---|---|---|
| 8,710,654 B2 | 4/2014 | Tsukiyama et al. | |
| 8,890,334 B2 | 11/2014 | Narita et al. | |
| 2006/0097409 A1* | 5/2006 | Shironouchi | H01L 24/29 257/789 |
| 2014/0008797 A1* | 1/2014 | Jang | H01L 23/49816 257/738 |

FOREIGN PATENT DOCUMENTS

| | | |
|---|---|---|
| JP | 2013-008819 | 1/2013 |
| JP | 2013-008963 | 1/2013 |
| JP | 2014-027109 | 2/2014 |
| JP | 2014-167973 | 9/2014 |
| JP | 2015-090937 | 5/2015 |

* cited by examiner

FIG. 3A

D1=0.2GPa~10GPa

| R1(%) | 4.9 | | | | 8.6 | | | | 11 | | | | 20 | | | | 39.3 | | | | 78.5 | | | |
|---|---|---|---|---|---|---|---|---|---|---|---|---|---|---|---|---|---|---|---|---|---|---|---|---|
| D2(GPa) | 12 | 15 | 30 | 35 | 12 | 15 | 30 | 35 | 12 | 15 | 30 | 35 | 12 | 15 | 30 | 35 | 12 | 15 | 30 | 35 | 12 | 15 | 30 | 35 |
| E1 | − | + | + | + | − | + | + | + | − | + | + | + | − | + | + | + | − | + | + | + | − | + | + | + |
| E2 | / | − | − | − | / | − | − | − | / | + | + | + | / | + | + | + | / | + | + | + | / | + | + | + |
| E3 | + | + | + | − | + | + | + | − | + | + | + | − | + | + | + | − | + | + | + | − | − | − | − | − |

FIG. 3B

D1=15GPa

| R1(%) | 4.9 | | | | 8.6 | | | | 11 | | | | 20 | | | | 39.3 | | | | 78.5 | | | |
|---|---|---|---|---|---|---|---|---|---|---|---|---|---|---|---|---|---|---|---|---|---|---|---|---|
| D2(GPa) | 12 | 15 | 30 | 35 | 12 | 15 | 30 | 35 | 12 | 15 | 30 | 35 | 12 | 15 | 30 | 35 | 12 | 15 | 30 | 35 | 12 | 15 | 30 | 35 |
| E1 | − | + | + | + | − | + | + | + | − | + | + | + | − | + | + | + | − | + | + | + | − | + | + | + |
| E2 | / | − | − | − | / | − | − | − | / | − | + | − | / | − | + | − | / | − | + | − | / | − | − | − |
| E3 | + | + | + | − | + | + | + | − | + | + | + | − | + | + | + | − | + | + | + | − | − | − | − | − | ic # SEMICONDUCTOR DEVICE AND MANUFACTURING METHOD OF THE SAME

CROSS-REFERENCE TO RELATED APPLICATION

This application is based upon and claims the benefit of priority from Japanese Patent Application No. 2016-048898, filed Mar. 11, 2016, the entire contents of which are incorporated herein by reference.

FIELD

Embodiments described herein relate generally to a semiconductor device and a manufacturing method of the same.

BACKGROUND

In a semiconductor device, for example, a plurality of semiconductor chips are stacked and electrically connected to each other through bumps. It is desirable to obtain a stable electrical connection in such a structure.

DESCRIPTION OF THE DRAWINGS

FIGS. 3A and 3B are tables showing results of experiments on the semiconductor device of FIGS. 1A and 1B.

DETAILED DESCRIPTION

According to an embodiment of the disclosure, there is provided a semiconductor device in which a stable connection can be easily achieved, and a method of manufacturing the semiconductor device.

In general, according to an embodiment, a semiconductor device includes a wiring substrate, a first semiconductor element, a second semiconductor element, a bump, a bonding portion, and a resin portion. The second semiconductor element is between the wiring substrate and the first semiconductor element. The bump is between the first semiconductor element and the second semiconductor element and electrically connects the first semiconductor element and the second semiconductor element. The bonding portion is between the first semiconductor element and the second semiconductor element, bonds the first semiconductor element to the second semiconductor element, and has a first elastic modulus. The resin portion has a second elastic modulus higher than the first elastic modulus. A first portion of the resin portion is between the first semiconductor element and the second semiconductor element. The first semiconductor element and the second semiconductor element are between a second portion of the resin portion and the wiring substrate. A third portion of the resin portion is overlapped with the first semiconductor element and the second semiconductor element in a second direction intersecting with a first direction going from the wiring substrate toward the first semiconductor element.

Hereinafter, embodiments of the disclosure will be described with reference to the drawings. The drawings are drawn schematically and conceptually, and thus may not reflect specific scale views of a particular embodiment. Furthermore, dimensions and ratios of components may be different from drawing to drawing. The same elements as those already described in a previous drawing will be denoted with the same reference symbols in this disclosure and the respective drawings, and the detailed descriptions thereof will be appropriately omitted.

Figure 1A:
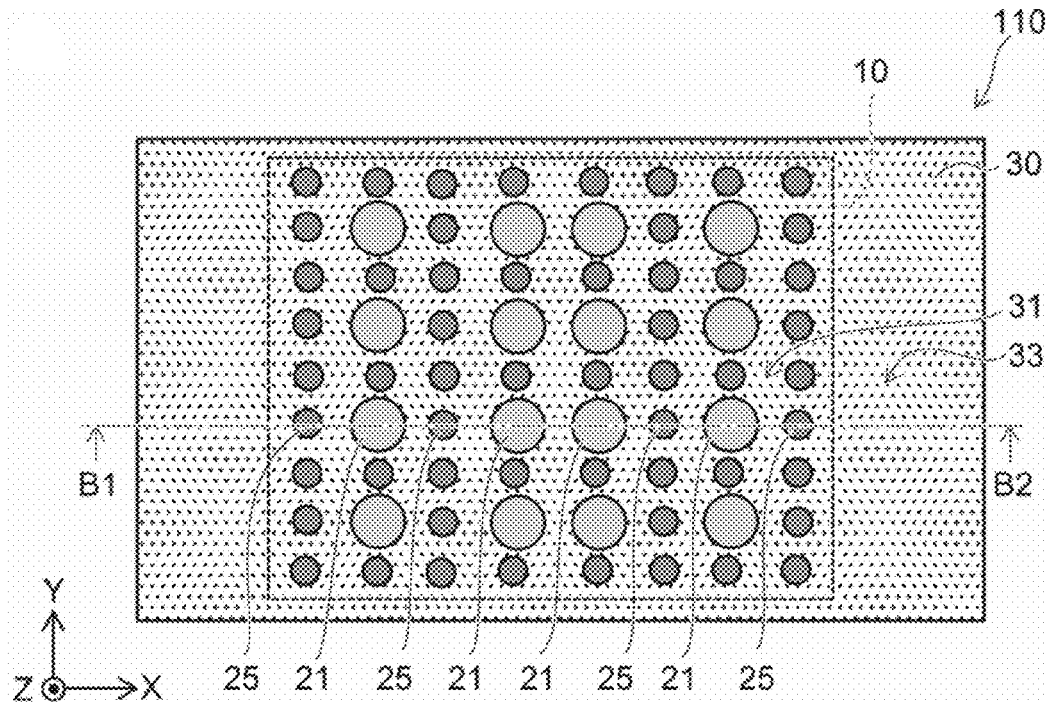
FIGS. 1A and 1B are cross-sectional views schematically illustrating a semiconductor device according to an embodiment.
Figure 1B:
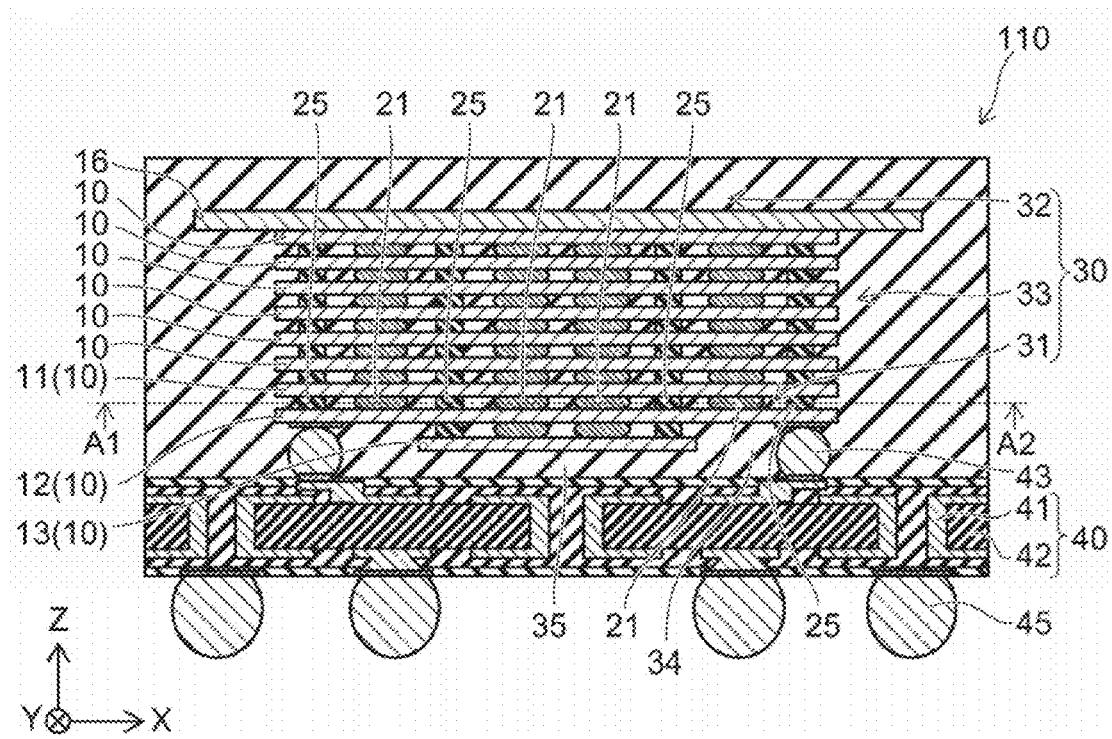

FIGS. 1A and 1B are cross-sectional views schematically illustrating a semiconductor device 110 according to an embodiment. FIG. 1A is a cross-sectional view taken along a line A1-A2 of FIG. 1B. FIG. 1B is a cross-sectional view taken along a line B1-B2 of FIG. 1A.

As illustrated in FIGS. 1A and 1B, the semiconductor device 110 includes a wiring substrate 40, a plurality of semiconductor elements 10, a bump 21, a bonding portion 25, and a resin portion 30.

The plurality of semiconductor elements 10 (for example, semiconductor chips) are stacked in the Z axis direction. Each of the semiconductor elements 10 may be the same as, or different from, any others of the semiconductor elements 10. In this example, the plurality of semiconductor elements 10 are separated from each other in the Z axis direction. The bump 21 and the bonding portion 25 are provided between two semiconductor elements 10. In this example, a lead frame 16 is further provided. The plurality of semiconductor elements 10 are arranged between the lead frame 16 and the wiring substrate 40.

The plurality of semiconductor elements 10 include, for example, a first semiconductor element 11, a second semiconductor element 12, and a third semiconductor element 13. The first semiconductor element 11 and the second semiconductor element 12 are, for example, memory chips. The third semiconductor element 13 is an interface which is used to convert data input from a connection member 45 to be a format which can be input to the semiconductor element 10, or to convert data output from the semiconductor element 10 to be a format which can be output from the connection member 45. A function of the semiconductor element 10 is arbitrary. For example, the size of the third semiconductor element 13 is different from those of the other semiconductor elements (for example, the first semiconductor element 11).

For example, the second semiconductor element 12 is provided between the wiring substrate 40 and the first semiconductor element 11. In this example, the third semiconductor element 13 is provided between the wiring substrate 40 and the second semiconductor element 12. The number of semiconductor elements 10 is arbitrary.

A direction from the wiring substrate 40 toward the first semiconductor element 11 (a first direction) is set to the Z axis direction in FIG. 1B. One direction perpendicular to the Z axis direction is set to an X axis direction. A direction perpendicular to the Z axis direction and the X axis direction is set to a Y axis direction.

A principal plane of the wiring substrate 40 is in parallel with an X-Y plane for example. The wiring substrate 40 has a plate shape extending along the X-Y plane for example. Each of the plurality of semiconductor elements 10 has a plate shape extending along the X-Y plane. A stacking direction of the plurality of semiconductor elements 10 corresponds to the Z axis direction.

Hereinafter, the description will be made about the first semiconductor element 11 and the second semiconductor element 12 among the plurality of semiconductor elements 10.

The bump 21 is provided between the first semiconductor element 11 and the second semiconductor element 12. The bump 21 electrically connects the first semiconductor element 11 and the second semiconductor element 12.

The bonding portion 25 is provided between the first semiconductor element 11 and the second semiconductor element 12. The bonding portion 25 bonds the first semiconductor element 11 and the second semiconductor element 12. The bonding portion 25 is in parallel with the bump 21 in the X-Y plane. The bonding portion 25 has a first elastic modulus. The first elastic modulus is relatively low.

As illustrated in FIG. 1A, a plurality of bumps 21 may be provided. The plurality of bumps 21 are in parallel with each other in the X-Y plane. For example, some of the plurality of bumps 21 are in parallel with each other in the X axis direction, and some of the plurality of bumps 21 are in parallel with each other in the Y axis direction.

As illustrated in FIG. 1A, a plurality of bonding portions 25 may be provided. The plurality of bonding portions 25 are in parallel with each other in the X-Y plane. For example, some of the plurality of bonding portions 25 are in parallel with each other in the X axis direction, and some of the plurality of bonding portions 25 are in parallel with each other in the Y axis direction. The size of the bonding portion 25 may be larger or smaller than that of the bump 21, or the two may be equal to each other.

For example, the plurality of semiconductor elements 10 and the wiring substrate 40 are electrically connected by connection members 43. In this example, the wiring substrate 40 includes a substrate 42 and a through electrode 41. The through electrode 41 passes through the substrate 42. The connection member 45 (the bump or the like) is provided at the lower surface of the wiring substrate 40. The semiconductor device 110 is mounted on other mounting components (not illustrated) through the connection member 45.

The resin portion 30 is provided around the plurality of semiconductor elements 10. The resin portion 30 is also provided in a region between the semiconductor elements 10.

As illustrated in FIG. 1B, a first portion 31 of the resin portion 30 is provided between the first semiconductor element 11 and the second semiconductor element 12. The plurality of semiconductor elements 10 (the first semiconductor element 11 and the second semiconductor element 12) are arranged between a second portion 32 of the resin portion 30 and the wiring substrate 40. A third portion 33 of the resin portion 30 is overlapped with the first semiconductor element 11 and the second semiconductor element 12 in a second direction (an arbitrary direction in the X-Y plane) intersecting with the Z axis direction (the first direction going from the wiring substrate 40 toward the first semiconductor element 11). For example, the side surfaces of the plurality of semiconductor elements 10 are surrounded by the third portion 33.

The resin portion 30 has a second elastic modulus. The second elastic modulus is higher than the first elastic modulus of the bonding portion 25. In other words, the first elastic modulus of the bonding portion 25 is lower than the second elastic modulus of the resin portion 30. A material having a low elastic modulus is used in the bonding portion 25. On the other hand, a material having a high elastic modulus is used in the resin portion 30. For example, an acrylic resin having a low elastic modulus is used in the bonding portion 25. On the other hand, an epoxy resin having a high elastic modulus is used in the resin portion 30.

A material having a high elastic modulus is used as the resin portion 30 sealing the periphery of the plurality of semiconductor elements 10, and thus bending of a package can be suppressed for example. For example, resistance against a stress applied from the outside can be increased. The semiconductor element 10 can be protected from being damaged from the outside. The resin portion 30 for sealing is a mold resin for example.

It has been found that a connection defect caused by the bump 21 provided between the plurality of semiconductor elements 10 occurs when such a mold resin having a relatively high elastic modulus is provided even between the plurality of semiconductor elements 10. For example, cracks are easily generated in the surfaces between the bump 21 and the semiconductor element 10. In some cases, there occurs peeling. Alternatively, cracks and peeling may be generated in an electrode layer of the semiconductor element 10 connected to the bump 21.

According to experiments performed by the inventors of this application, it has been found that a symptom of the connection defect is relieved when the bonding portion 25 is provided between the semiconductor elements 10 to bond the semiconductor elements 10. Then, it has been found that the connection defect in the bump 21 can be suppressed by setting the elastic modulus of the bonding portion 25 to be relatively low.

In the embodiment, the semiconductor elements 10 are bonded to each other by the bonding portion 25, and the first elastic modulus of the bonding portion 25 is set to be lower than the second elastic modulus of the resin portion 30. Therefore, the connection defect in the bump 21 can be suppressed. In the embodiment, it is possible to provide a semiconductor device which can achieve a stable connection. In the embodiment, it is possible to achieve a stable electrical connection while suppressing the bending of the package and keeping the resistance against a high stress applied from the outside.

As illustrated in FIG. 1B, in the embodiment, a fourth portion 34 of the resin portion 30 may be arranged between the wiring substrate 40 and the second semiconductor element 12. The connection defect in this portion can be suppressed. A fifth portion 35 of the resin portion 30 may be arranged between the wiring substrate 40 and the third semiconductor element 13. The connection defect in this portion can be suppressed. For example, a portion of the resin portion 30 may be arranged between the wiring substrate 40 and the semiconductor element 10 closest to the wiring substrate 40 among the plurality of semiconductor elements 10. For example, the resin portion 30 surrounds the plurality of semiconductor elements 10. The plurality of semiconductor elements 10 are sealed and protected by the resin portion 30.

Figure 2A:
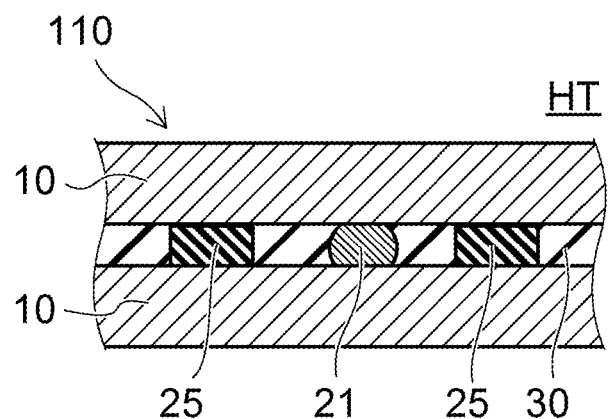
FIGS. 2A to 2F are cross-sectional views schematically illustrating features of the semiconductor device.
Figure 2B:
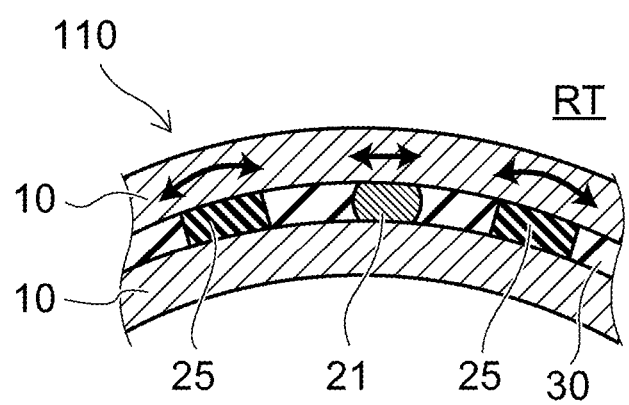

FIGS. 2A and 2B are cross-sectional views schematically illustrating features of the semiconductor device 110. FIGS. 2C to 2F are cross-sectional views of reference example semiconductor devices. These drawings illustrate exemplary features of bending in the reference examples.

Figure 2C:
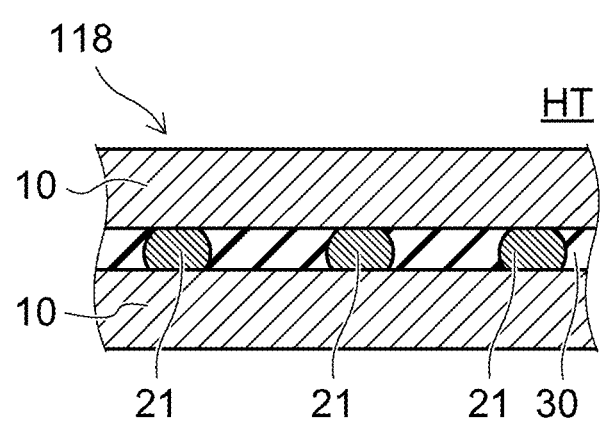
Figure 2D:
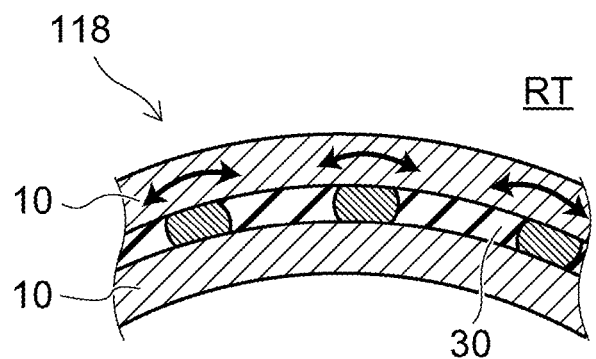
Figure 2E:
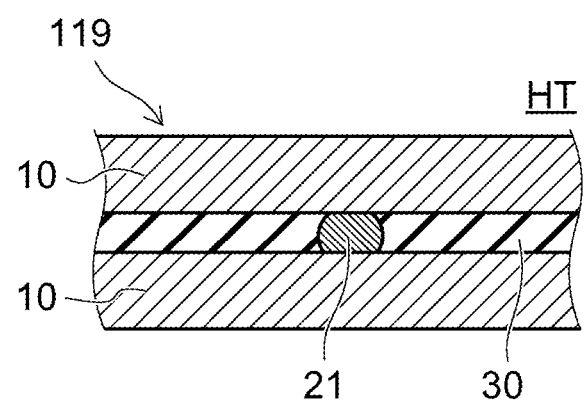
Figure 2F:
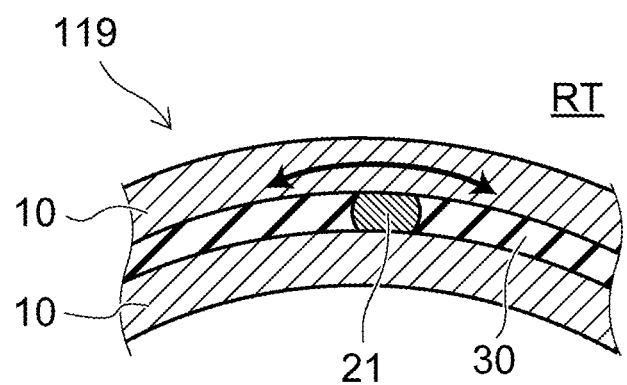

FIGS. 2A and 2B correspond to the semiconductor device 110 according to the embodiment. In the semiconductor device 110, the bump 21, the bonding portion 25, and the resin portion 30 are provided between two semiconductor elements 10. FIGS. 2C and 2D correspond to a semiconductor device 118 according to a first reference example. In the semiconductor device 118, the bump 21 and the resin portion 30 are provided between two semiconductor elements 10, and the bonding portion is not provided. FIGS. 2E and 2F correspond to a semiconductor device 119 according to a second reference example. In the semiconductor device 119, the bump 21 and the resin portion 30 are provided between two semiconductor elements 10, and the bonding portion is not provided. The number (concentration) of bumps 21 in the semiconductor device 118 is higher than the number (concentration) of bumps 21 in the semiconductor device 119.

FIGS. 2A, 2C, and 2E correspond to a high temperature state HT in the middle of manufacturing. For example, this state corresponds to a state of the connection with the bump 21 and the curing of the resin portion 30. A temperature in the high temperature state HT is about 150° C. to 175° C. FIGS. 2B, 2D, and 2F correspond to a room temperature state RT (ordinary temperature state) after manufacturing. A temperature in the room temperature state RT is about 23° C. for example.

As illustrated in FIGS. 2A, 2C, and 2E, there occurs no substantial bending in a stacked body (the plurality of semiconductor elements 10) even in the semiconductor device in the high temperature state HT in the middle of manufacturing. Therefore, the bump 21 actually does not receive a stress.

As illustrated in FIGS. 2B, 2D, and 2F, there occurs the bending in the stacked body in the room temperature state RT. This bending is based on a difference of a thermal expansion coefficient in the stacked body (the plurality of semiconductor elements 10) for example. A stress occurs due to the bending. As illustrated in FIGS. 2D and 2F, the stress is added to a connection region with respect to the bump 21 in the semiconductor devices 118 and 119. Therefore, the cracks or the peeling occurs between the bump 21 and the semiconductor element 10.

On the contrary, in the semiconductor device 110, the bonding portion 25 having a low elastic modulus is provided in a portion other than the bump 21. A portion abutting on the bonding portion 25 in the semiconductor element 10 is deformed by the stress caused by the bending. The stress is alleviated by the deformation. Therefore, the stress in the region connected to the bump 21 in the semiconductor element 10 is reduced. The bending is reduced in the region connected to the bump 21 in the semiconductor element 10. Since the stress is reduced in the region connected to the bump 21 in the semiconductor element 10, the cracks or the peeling can be suppressed in the bump 21. Therefore, a stable electrical connection is obtained.

Hereinafter, a result of an experiment performed by the inventors will be described as an example. In the experiment described below, two types of materials are used as the bonding portion 25. An elastic modulus D1 of a first material at a room temperature (23° C.) is 0.2 GPa to 10 GPa. An elastic modulus D1 of a second material at the room temperature (23° C.) is about 15 GPa. With the use of these materials, an area ratio of the bonding portion 25 is changed. For example, if the plurality of bonding portions 25 are provided, and a total area of the plurality of bonding portions 25 is $S_{25}$ (the area in the X-Y plane), and one of the semiconductor elements 10 has an area in the X-Y plan of $S_{10}$, an area ratio R1 (%) is $(S_{25}/S_{10}) \times 100(\%)$. Furthermore, four types of materials are used as the resin portion 30. An elastic modulus D2 of these materials at the room temperature (23° C.) is 12 GPa, 15 GPa, 30 GPa, or 35 GPa.

Three types of evaluations are performed on the samples using the bonding portion 25, the area ratio R1, and the resin portion 30. In a first evaluation, package crack in a moisture absorption and ref low test is evaluated. In a second evaluation, bump connection defect in a temperature cycle test is evaluated. In a third evaluation, unfilling of the resin portion 30 into the plurality of semiconductor elements 10 is evaluated.

FIGS. 3A and 3B are tables showing the experimental results on the semiconductor device. FIG. 3A shows an evaluation result when the first material (the elastic modulus D1=0.2 GPa to 10 GPa) is used as the bonding portion 25. FIG. 3B shows an evaluation result when the second material (the elastic modulus D1=15 GPa) is used as the bonding portion 25. In the drawing (tables), the area ratio R1 of the bonding portion 25 and the elastic modulus D2 of the resin portion 30 are shown.

An evaluation result E1 corresponds to the first evaluation, in which a "+" mark corresponds to a result that the package crack is not detected in the moisture absorption and reflow test. A "−" mark corresponds to a result that the package crack is detected in the moisture absorption and reflow test.

An evaluation result E2 corresponds to the second evaluation, in which a "+" mark corresponds to a result that the bump connection defect does not occur in the temperature cycle test. A "−" mark corresponds to a result that the bump connection defect occurs in the temperature cycle test.

An evaluation result E3 corresponds to the third evaluation, in which a "+" mark corresponds to a result that the unfilling is not detected. A "−" mark corresponds to a result that the unfilling is detected.

In these tables, a "/" mark indicates that the evaluation is not possible. For example, it is not possible to perform the second evaluation (the temperature cycle test) on a sample in which the package crack occurs in the moisture absorption and reflow test in the first evaluation. In these tables, a "+" mark corresponds to a good result.

As illustrated in FIG. 3B, in a case where the bonding portion 25 has a high elastic modulus D1 of 15 GPa, a condition for a good result is narrow. For example, the bump connection defect easily occurs in the temperature cycle test (the second evaluation result E2).

As illustrated in FIG. 3A, in a case where the bonding portion 25 has a low elastic modulus D1 of 0.2 GPa to 10 GPa, the condition for a good result is widened. For example, the bump connection defect is suppressed from occurring in the temperature cycle test (the second evaluation result E2). In the embodiment, it is desirable that the elastic modulus D1 (the first elastic modulus) of the bonding portion 25 at 23° C. be 0.2 GPa or more and 10 GPa or less for example.

As illustrated in FIG. 3A, in a case where the bonding portion 25 has a low elastic modulus D1, the unfilling occurs when the area ratio R1 is 78.5% (the third evaluation result E3). When the area ratio R1 is excessively high, a width of the space between two semiconductor elements 10 (an area of a filling path of the resin portion 30) becomes narrow. Therefore, the resin portion 30 hardly enters the space between two semiconductor elements 10. Thus, the area ratio R1 is desirably less than 78.5%, for example equal to or less than 39.3%.

On the other hand, in a case where the bonding portion 25 has a low elastic modulus D1, the bump connection defect easily occurs in the temperature cycle test (the second evaluation result E2) when the area ratio R1 is 4.9% or 8.6%. When the area ratio R1 is excessively low, the effect of stress alleviation obtained by providing the bonding portion 25 is reduced. The area ratio R1 is desirably higher than 8.6%, for example equal to or more than 11%.

As illustrated in FIG. 3A, in a case where the elastic modulus D1 of the bonding portion 25 is low, and the elastic modulus D2 of the resin portion 30 is 12 GPa, the package crack occurs in the moisture absorption and reflow test (the first evaluation result E1). When the elastic modulus D2 of the resin portion 30 is 15 GPa, 30 GPa, or 35 GPa, the package crack does not occur in the moisture absorption and reflow test (the first evaluation result E1).

For example, a good result is obtained in the moisture absorption and reflow test (the first evaluation result E1), the temperature cycle test (the second evaluation result E2), and the unfilling (the third evaluation result E3) when the elastic modulus D2 of the resin portion 30 at 23° C. is 15 GPa or more and 30 GPa or less. In the embodiment, for example, the elastic modulus D2 (the second elastic modulus) of the resin portion 30 at 23° C. is 15 GPa or more and 30 GPa or less.

For example, the second elastic modulus of the resin portion 30 at 23° C. is desirably 1.5 or more times or 60 or less times the first elastic modulus of the bonding portion 25 at 23° C. A good result is obtained in the first to third evaluation results E1 to E3. In a case where a difference between the second elastic modulus and the first elastic modulus is large, a measuring method of the second elastic modulus may be different from that of the first elastic modulus.

Figure 4A:
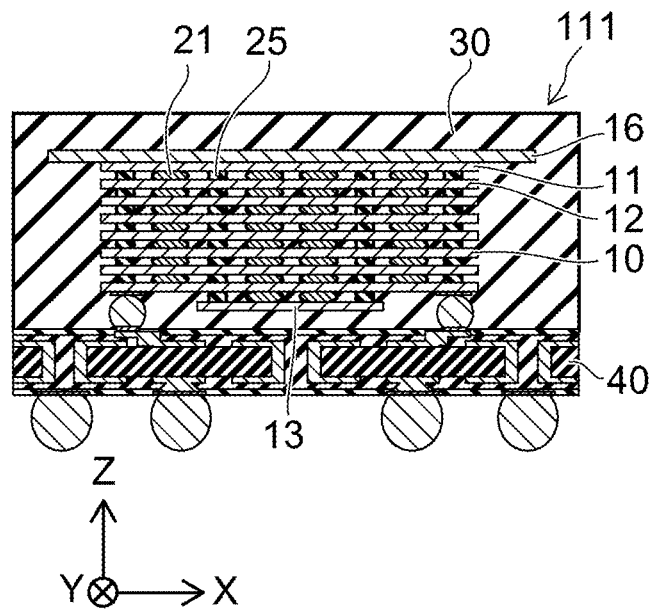
FIGS. 4A to 4F are cross-sectional views schematically illustrating other semiconductor devices according to the embodiment.

FIGS. 4A to 4F are cross-sectional views schematically illustrating other semiconductor devices according to the embodiment. In another semiconductor device 111 according to the embodiment as illustrated in FIG. 4A, a position of a set of the first semiconductor element 11 and the second semiconductor element 12 is arbitrarily set in the plurality of semiconductor elements 10. In this example, the first semiconductor element 11 is the uppermost layer in the plurality of semiconductor elements 10.

Figure 4B:
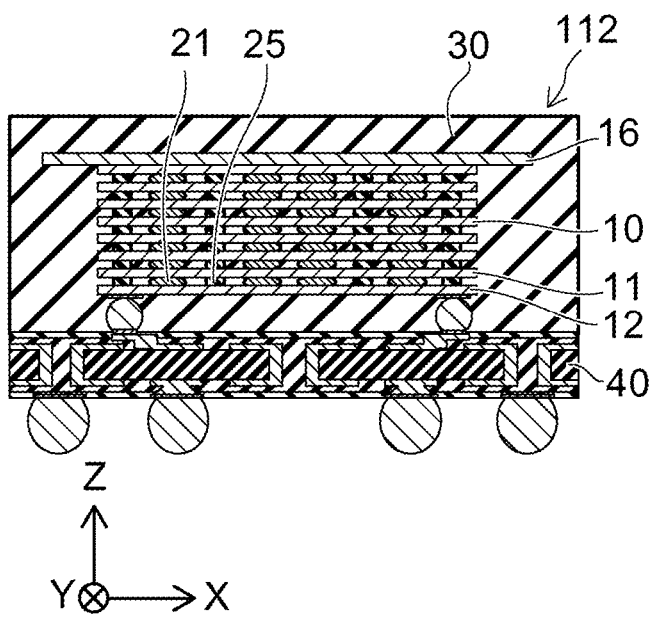

In another semiconductor device 112 according to the embodiment as illustrated in FIG. 4B, the third semiconductor element 13 (which is different in size) is not provided.

Figure 4C:
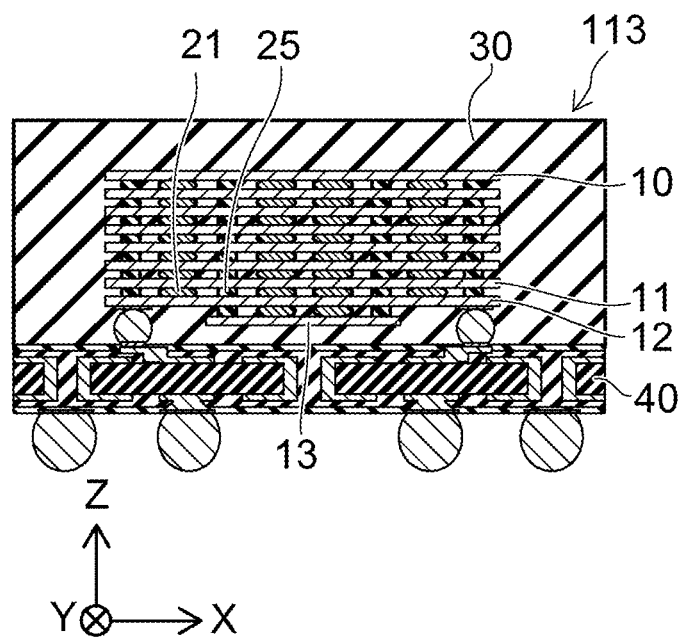

As illustrated in FIG. 4C, the lead frame 16 (see FIG. 1B) is omitted in another semiconductor device 113 according to the embodiment.

Figure 4D:
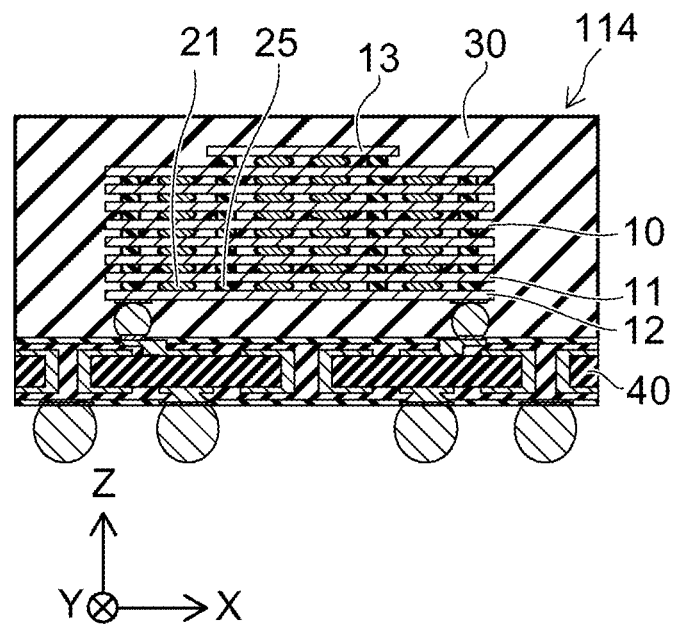

As illustrated in FIG. 4D, in another semiconductor device 114 according to the embodiment, the first semiconductor element 11 and the second semiconductor element 12 are arranged between the third semiconductor element 13 (which is different in size) and the wiring substrate 40.

Figure 4E:
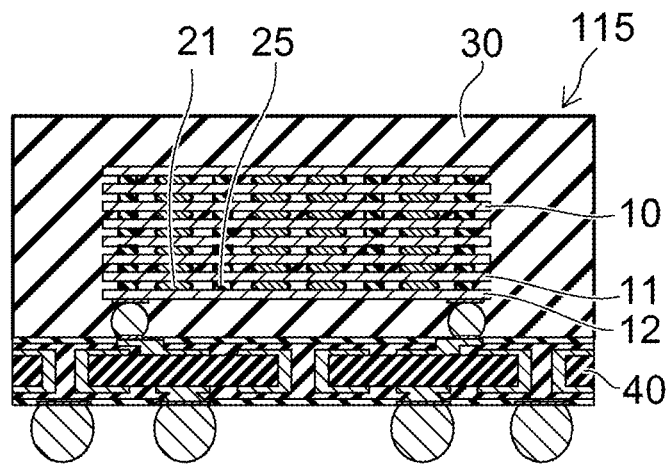
Figure 4E:
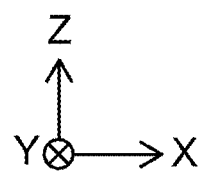

As illustrated in FIG. 4E, in another semiconductor device 115 according to the embodiment, the third semiconductor element 13 (which is different in size) is not provided, and the lead frame 16 is omitted.

Figure 4F:
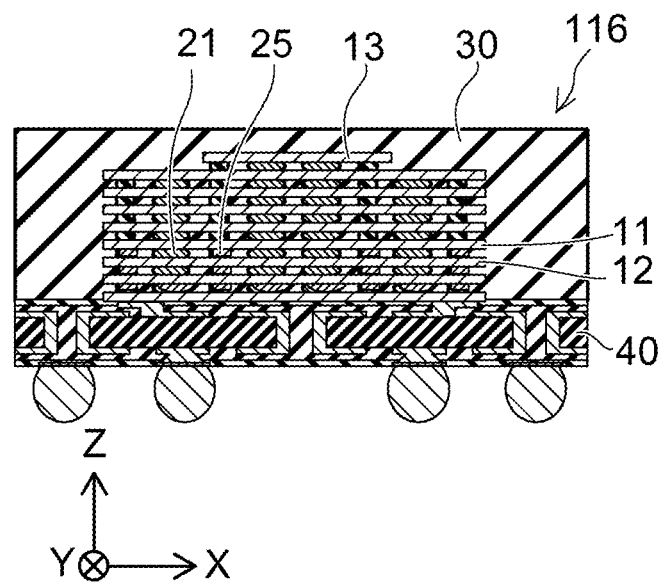

As illustrated in FIG. 4F, in another semiconductor device 116 according to the embodiment, the first semiconductor element 11 and the second semiconductor element 12 are arranged between the third semiconductor element 13 (which is different in size) and the wiring substrate 40. Then, one of the plurality of semiconductor elements 10 substantially abuts on the wiring substrate 40.

In this way, the configuration of the plurality of semiconductor elements 10 in the embodiment may be variously modified.

Hereinafter, description will be provided about an example of a method of manufacturing the semiconductor device according to the embodiment. In the following, the description will be about a case where the semiconductor device 110 is manufactured.

Figure 5A:
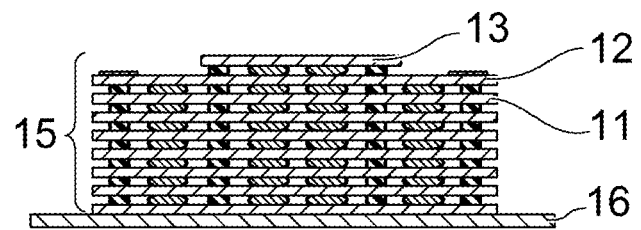
FIGS. 5A to 5D are cross-sectional views schematically illustrating a method of manufacturing the semiconductor device according to the embodiment.

FIGS. 5A to 5D are cross-sectional views schematically illustrating a procedure of the method of manufacturing the semiconductor device according to the embodiment. As illustrated in FIG. 5A, the plurality of semiconductor elements 10 are stacked to form a stacked body 15. The bump 21 and the bonding portion 25 are provided between the semiconductor elements 10. In this example, the stacked body 15 is provided on the lead frame 16.

Figure 5B:

As illustrated in FIG. 5B, the wiring substrate 40 is prepared. In this example, the connection member 43 is provided on a portion of the wiring substrate 40. The connection member 43 may be provided in the stacked body 15.

Figure 5C:
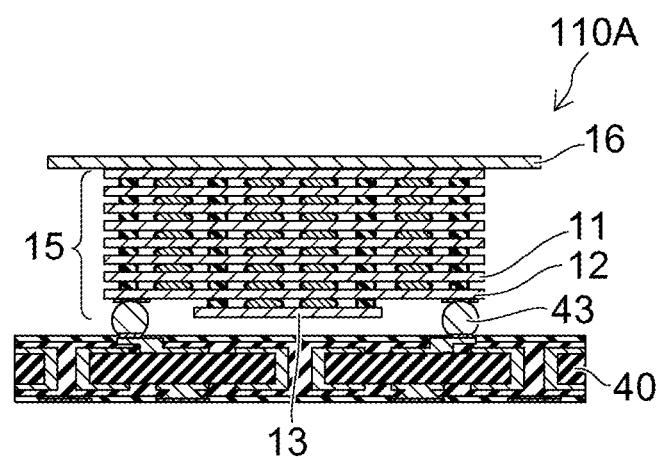

As illustrated in FIG. 5C, the stacked body 15 and the wiring substrate 40 are stacked. The connection member 43 electrically connects the stacked body 15 and the wiring substrate 40. Therefore, a workpiece 110A is obtained. The method of manufacturing the semiconductor device according to this embodiment may include a procedure of preparing the workpiece 110A as described above.

The workpiece 110A includes the first semiconductor element 11, the second semiconductor element 12, the bump 21, and the bonding portion 25. The second semiconductor element 12 is provided between the wiring substrate 40 and the first semiconductor element 11. The bump 21 is provided between the first semiconductor element 11 and the second semiconductor element 12, and electrically connects the first semiconductor element 11 and the second semiconductor element 12. The bonding portion 25 is provided between the first semiconductor element 11 and the second semiconductor element 12, and bonds the first semiconductor element 11 and the second semiconductor element 12. The bonding portion 25 has the first elastic modulus.

Figure 5D:
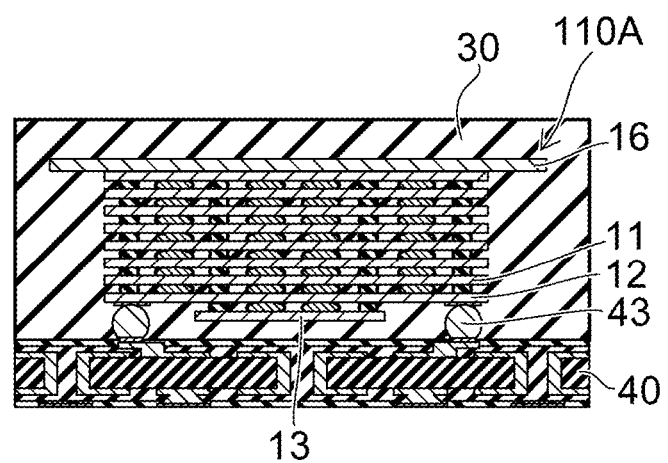

As illustrated in FIG. 5D, the resin portion 30 is formed between the first semiconductor element 11 and the second semiconductor element 12 and around the first semiconductor element 11 and the second semiconductor element 12 of the workpiece 110A described above. The resin portion 30 has the second elastic modulus higher than the first elastic modulus.

Thereafter, the connection member 45 is formed as needed. Therefore, the semiconductor device 110 is formed. According to the embodiment, it is possible to provide a method of manufacturing the semiconductor device in which a stable connection is easily achieved.

According to the embodiment, it is possible to provide the semiconductor device in which a stable connection can be easily achieved, and the method of manufacturing the semiconductor device.

In this disclosure, "vertical" and "parallel" do not mean a strict vertical state and a strict parallel state. For example, a variation may occur in the manufacturing procedure, and they may mean a substantial vertical state and a substantial parallel state.

Hitherto, the embodiments of the disclosure have been described with reference to the specific examples. However, the embodiments of the disclosure are not limited to these specific examples. For example, a person skilled in the art may implement the specific configuration of each element such as the wiring substrate, the semiconductor element, the bump, the bonding portion, and the resin portion included in the semiconductor device by appropriately selecting the elements from a well-known range. Also this case is included in the scope of the disclosure as long as the same effect can be achieved.

In addition, any two or more elements of the respective specific examples combined in a technically possible range are also included in the scope of the disclosure as long as it is included in the spirit of the disclosure.

Besides, all the semiconductor devices and the manufacturing method thereof obtained appropriately modified by a person skilled in the art based on the semiconductor device and the manufacturing method thereof described above as the embodiment of the disclosure may also be included in the scope of the disclosure as long as they do not depart from the spirit of the disclosure.

Further, a person skilled in the art may perceive various modifications and changes within a category of idea of the disclosure. These modifications and changes are also considered as included in the scope of the disclosure.

While certain embodiments have been described, these embodiments have been presented by way of example only, and are not intended to limit the scope of the inventions. Indeed, the novel embodiments described herein may be embodied in a variety of other forms; furthermore, various omissions substitutions and changes in the form of the embodiments described herein may be made without departing from the spirit of the inventions. The accompanying claims and their equivalents are intended to cover such embodiments or modifications as would fall within the scope and spirit of the inventions.

What is claimed is:

1. A semiconductor device, comprising:
   a substrate;
   a first semiconductor element;
   a second semiconductor element between the substrate and the first semiconductor element;
   a bump between the first semiconductor element and the second semiconductor element and electrically connecting the first semiconductor element and the second semiconductor element;
   a bonding portion between the first semiconductor element and the second semiconductor element, bonding the first semiconductor element to the second semiconductor element and having a first elastic modulus, wherein a ratio of an area of the bonding portion to an area of the first semiconductor element is 11% or more and less than 78.5%; and
   a resin portion that has a second elastic modulus higher than the first elastic modulus, wherein a first portion of the resin portion is between the first semiconductor element and the second semiconductor element.

2. The semiconductor device according to claim 1, wherein:
   the first semiconductor element and the second semiconductor element are arranged between a second portion of the resin portion and the substrate, and
   a third portion of the resin portion is overlapped with the first semiconductor element and the second semiconductor element in a second direction intersecting with a first direction going from the substrate toward the first semiconductor element.

3. The semiconductor device according to claim 2, wherein a fourth portion of the resin portion is between the substrate and the second semiconductor element.

4. The semiconductor device according to claim 2, wherein the first elastic modulus at 23° C. is 0.2 GPa or more and 10 GPa or less.

5. The semiconductor device according to claim 2, wherein the second elastic modulus at 23° C. is 15 GPa or more and 30 GPa or less.

6. The semiconductor device according to claim 2, wherein the second elastic modulus at 23° C. is 1.5 or more times and 60 or less times the first elastic modulus at 23° C.

7. The semiconductor device according to claim 2, wherein the ratio of the area of the bonding portion to the area of the first semiconductor element is 11% or more and 39.3% or less.

8. The semiconductor device according to claim 1, wherein the first elastic modulus at 23° C. is 0.2 GPa or more and 10 GPa or less.

9. The semiconductor device according to claim 1, wherein the bonding portion is acrylic resin and the resin portion is epoxy resin.

10. The semiconductor device according to claim 1, wherein the ratio of the area of the bonding portion to the area of the first semiconductor element is 11% or more and 39.3% or less.

11. A semiconductor device, comprising:
    a substrate;
    a first semiconductor element;
    a second semiconductor element between the substrate and the first semiconductor element;
    a bump between the first semiconductor element and the second semiconductor element and electrically connecting the first semiconductor element and the second semiconductor element;
    a bonding portion between the first semiconductor element and the second semiconductor element, bonding the first semiconductor element to the second semiconductor element and having a first elastic modulus; and
    a resin portion that has a second elastic modulus higher than the first elastic modulus, wherein the second elastic modulus at 23° C. is 15 GPa or more and 30 GPa or less, and wherein a first portion of the resin portion is between the first semiconductor element and the second semiconductor element.

12. A semiconductor device, comprising:
    a substrate;
    a first semiconductor element;
    a second semiconductor element between the substrate and the first semiconductor element;
    a bump between the first semiconductor element and the second semiconductor element and electrically connecting the first semiconductor element and the second semiconductor element;
    a bonding portion between the first semiconductor element and the second semiconductor element, bonding the first semiconductor element to the second semiconductor element and having a first elastic modulus; and
    a resin portion that has a second elastic modulus that is 1.5 or more times and 60 or less times the first elastic modulus at 23° C.;
    wherein a ratio of an area of the bonding portion to an area of the first semiconductor element is 11% or more and less than 78.5% and a first portion of the resin portion is between the first semiconductor element and the second semiconductor element.

13. The semiconductor device according to claim 12, wherein the first elastic modulus at 23° C. is 0.2 GPa or more and 10 GPa or less.

14. The semiconductor device according to claim 12, wherein the bonding portion is acrylic resin and the resin portion is epoxy resin.

15. The semiconductor device according to claim 12, wherein the ratio of the area of the bonding portion to the area of the first semiconductor element is 11% or more and less than 39.3%.

16. The semiconductor device according to claim 12, wherein the second elastic modulus at 23° C. is 15 GPa or more and 30 GPa or less.

* * * * *